(12) United States Patent
Huang et al.

(10) Patent No.: US 12,477,777 B2
(45) Date of Patent: Nov. 18, 2025

(54) THIN FILM TRANSISTOR, DISPLAY SUBSTRATE AND DISPLAY DEVICE

(71) Applicant: BOE TECHNOLOGY GROUP CO., LTD., Beijing (CN)

(72) Inventors: Jie Huang, Beijing (CN); Ce Ning, Beijing (CN); Zhengliang Li, Beijing (CN); Hehe Hu, Beijing (CN); Niangi Yao, Beijing (CN); Kun Zhao, Beijing (CN); Feifei Li, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/021,778

(22) PCT Filed: Mar. 31, 2022

(86) PCT No.: PCT/CN2022/084618
§ 371 (c)(1),
(2) Date: Feb. 16, 2023

(87) PCT Pub. No.: WO2023/184421
PCT Pub. Date: Oct. 5, 2023

(65) Prior Publication Data
US 2024/0274674 A1   Aug. 15, 2024

(51) Int. Cl.
*H10D 30/67* (2025.01)

(52) U.S. Cl.
CPC ....... *H10D 30/6729* (2025.01); *H10D 30/673* (2025.01)

(58) Field of Classification Search
CPC .. H10D 30/6755; H10D 62/10; H10D 30/673; H10D 30/6729; H10D 64/27;
(Continued)

(56) References Cited

U.S. PATENT DOCUMENTS

| | | | |
|---|---|---|---|
| 2012/0153288 A1* | 6/2012 | Yuan | H10D 86/60 257/E33.053 |
| 2013/0221343 A1* | 8/2013 | Son | H10D 30/675 257/43 |

(Continued)

FOREIGN PATENT DOCUMENTS

| | | |
|---|---|---|
| CN | 102832235 A | 12/2012 |
| CN | 103456795 A | 12/2013 |

(Continued)

*Primary Examiner* — Mouloucoulaye Inoussa
(74) *Attorney, Agent, or Firm* — Nath, Goldberg & Meyer; Joshua B. Goldberg

(57) ABSTRACT

Provided are a thin film transistor, a display substrate and a display device, the thin film transistor includes: a gate on a base substrate; an active layer between the gate and the base substrate, the active layer includes a source contact portion, a drain contact portion and a middle portion therebetween, orthographic projections of the middle portion and the gate on the base substrate overlaps to form a first overlapping region, a material of the middle portion includes a metal oxide containing a doped element, a dissociation energy of the doped element from an oxygen element is greater than 500 Kj/mol; a source connected to the source contact portion and a drain connected to the drain contact portion, a ratio of an area of the orthographic projection of the gate on the base substrate to an area of the first overlapping region is less than or equal to 3.

20 Claims, 6 Drawing Sheets

(58) Field of Classification Search
CPC .. H10D 30/67; H10D 86/423; H10D 30/6757; H10D 62/80; H10D 86/60; H10D 30/031; H01L 21/34; H01L 21/02521; H01L 21/02554; H10K 85/221; H10K 10/484; H10K 10/464

See application file for complete search history.

(56) References Cited

U.S. PATENT DOCUMENTS

| | | | | |
|---|---|---|---|---|
| 2015/0280000 | A1* | 10/2015 | Seon | H10D 64/693 |
| | | | | 257/66 |
| 2015/0340511 | A1* | 11/2015 | Yan | H10F 39/8057 |
| | | | | 257/43 |
| 2016/0005870 | A1* | 1/2016 | Huang | H10D 86/00 |
| | | | | 257/43 |
| 2021/0406660 | A1* | 12/2021 | Chen | H10N 70/8822 |
| 2022/0384599 | A1* | 12/2022 | Yang | H10D 62/121 |
| 2022/0406666 | A1* | 12/2022 | Huang | H01L 21/31155 |
| 2023/0040346 | A1* | 2/2023 | Chang | H10D 62/121 |
| 2024/0145636 | A1* | 5/2024 | Park | H10H 20/0137 |

FOREIGN PATENT DOCUMENTS

| | | |
|---|---|---|
| CN | 111081722 A | 4/2020 |
| CN | 113140637 A | 7/2021 |

* cited by examiner

THIN FILM TRANSISTOR, DISPLAY SUBSTRATE AND DISPLAY DEVICE This is a National Phase Application filed under 35 U.S.C. 371 as a national stage of PCT/CN2022/084618, filed Mar. 31, 2022, the content of which is hereby incorporated by reference in its entirety.

TECHNICAL FIELD

The present disclosure relates to the field of display technology, and in particular to a thin film transistor, a display substrate and a display device.

BACKGROUND

An active layer of a conventional thin film transistor (TFT) is made of an a-Si (amorphous silicon) material, which has low carrier mobility and is difficult to meet the requirement on driving an existing display with a large-size and a high-driving-frequency. Therefore, in some display products, the active layer may be made of an oxide semiconductor having high carrier mobility, such as zinc oxide (ZnO), Indium Gallium Zinc Oxide (IGZO), and Zinc Tin Oxide (ZTO).

SUMMARY

The present disclosure provides a thin film transistor, a display substrate and a display device.

In a first aspect, the present disclosure provides a thin film transistor including:
 a gate disposed on a base substrate;
 an active layer located between the gate and the base substrate and insulated and spaced from the gate, where the active layer includes a source contact portion, a drain contact portion and a middle portion located between the source contact portion and the drain contact portion, and an orthographic projection of the middle portion on the base substrate is overlapped with an orthographic projection of the gate on the base substrate to form a first overlapping region, a material of the middle portion includes a metal oxide containing a doped element, and a dissociation energy of the doped element from an oxygen element is greater than 500 Kj/mol;
 a source and a drain, the source being electrically connected to the source contact portion, the drain being electrically connected to the drain contact portion;
 where a ratio of an area of the orthographic projection of the gate on the base substrate to an area of the first overlapping region is less than or equal to 3.

In some implementations, the doped element includes at least one of a rare earth element, a tungsten element, or a tantalum element.

In some implementations, the orthographic projection of the middle portion on the base substrate is a first projection, the gate includes a plurality of first sides connected successively, an orthographic projection of at least one of the first sides on the base substrate is located outside the first projection, and a distance between the orthographic projection of the at least one of the first sides on the base substrate and the first projection is less than or equal to ¼ of a distance between the source contact portion and the drain contact portion.

In some implementations, a distance from the at least one of the first sides, whose orthographic projection on the base substrate is located outside the first projection, to the first projection is less than or equal to 1.5 μm.

In some implementations, an orthographic projection of each of the plurality of first sides on the base substrate is located outside the first projection.

In some implementations, a part of the orthographic projection of the middle portion on the base substrate exceeds the orthographic projection of the gate on the base substrate.

In a second aspect, the present disclosure provides a display substrate, which includes the thin film transistor described above.

In some implementations, the display substrate further includes: a plurality of first signal lines and a plurality of second signal lines, where the first signal lines and the second signal lines are intersected to define a plurality of pixel regions, each pixel region is provided with the thin film transistor therein, the gate of each thin film transistor is connected with one of the first signal lines, and the source of each thin film transistor is connected with one of the second signal lines.

In some implementations, the first signal lines each extend in a first direction, and for at least one thin film transistor, the source contact portion and the drain contact portion are arranged along the first direction, a protrusion serving as the gate of the thin film transistor is formed on a side of the first signal line along a second direction, and the first direction intersects the second direction.

In some implementations, for at least one thin film transistor, a portion of the first signal line connected to the thin film transistor is disposed opposite to the active layer of the thin film transistor, and the portion of the first signal line opposite to the active layer serves as the gate of the thin film transistor.

In some implementations, the first signal lines each extend in a first direction, and for at least one thin film transistor, the source contact portion and the drain contact portion are arranged along the first direction, and an orthographic projection of the first signal line connected to the thin film transistor on the base substrate passes through the orthographic projection of the middle portion on the base substrate.

In some implementations, the first signal lines each extend in a first direction, and for at least one thin film transistor, the source contact portion and the drain contact portion are arranged along a second direction, an orthographic projection of the first signal line connected to the thin film transistor on the base substrate passes through the orthographic projection of the middle portion on the base substrate, and the first direction intersects the second direction.

In a third aspect, the present disclosure provides a display device, including the display substrate described above.

BRIEF DESCRIPTION OF DRAWINGS

The accompanying drawings, which are included to provide a further understanding of the present disclosure and are incorporated in and constitute a part of this specification, illustrate implementations of the present disclosure and together with the description serve to explain the present disclosure, but do not constitute a limitation of the present disclosure.

DETAILED DESCRIPTION

Figure 1:
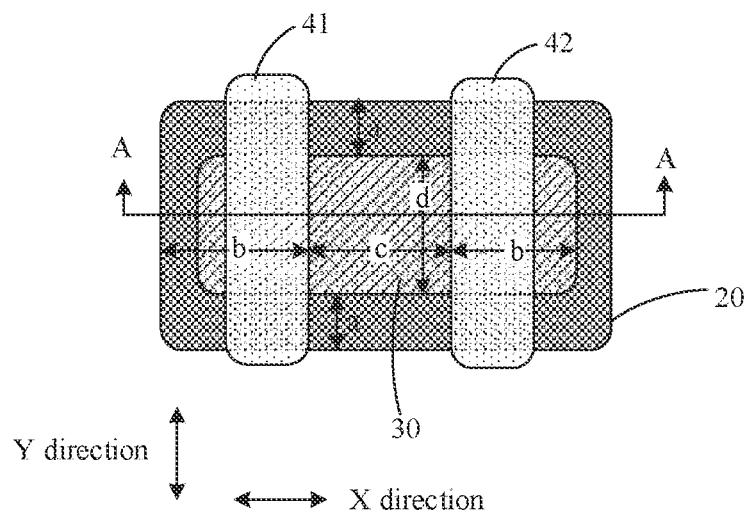
FIG. 1 is a top view of a thin film transistor provided in the present disclosure.

In order to make the objects, technical solutions and advantages of the present disclosure more apparent, the present disclosure will be described below in further detail with reference to the accompanying drawings, obviously, the described implementations are only part of implementations of the present disclosure, not all implementations. All other implementations, which can be obtained by a person skilled in the art without making any creative effort based on the implementations in the present disclosure, fall within the protection scope of the present disclosure.

Terminologies used herein to describe the implementations of the present disclosure are not intended to limit and/or define the scope of the present disclosure. For example, Unless defined otherwise, technical or scientific terms used herein shall have the ordinary meaning as understood by one of ordinary skill in the art to which this disclosure belongs. The terms "first," "second," and the like, as used in the description, do not denote any order, quantity, or importance, but rather are used to distinguish one element from another. Also, the use of the terms "a," "an,", "the" or the like does not denote a limitation of quantity, but rather denotes the presence of at least one. The word "comprising/including" or "comprises/includes", and the like, means that the element or item preceding the word contains the element or item listed after the word and its equivalent, but does not exclude other elements or items. The terms "connecting" or "coupling" and the like are not restricted to physical or mechanical connections, but may include electrical connections, whether direct or indirect. The words "upper/on", "lower/under/below", "left", "right", and the like are used only to indicate relative positional relationships, and when the absolute position of the object being described is changed, the relative positional relationships may be changed accordingly.

In the following description, when an element or layer is referred to as being "on" or "connected to" another element or layer, the element or layer may be directly on the another element or layer, directly connected to the another element or layer, or an intermediate element or layer may be existed therebetween. However, when an element or layer is referred to as being "directly on" or "directly connected to" another element or layer, no intermediate element or layer is existed therebetween. The term "and/or" includes any and all combinations of one or more related listed items.

A display substrate includes a display area, and a plurality of gate lines and a plurality of data lines are arranged in the display area, the gate lines and the data lines are intersected to define a plurality of pixels, and each pixel is provided with a thin film transistor therein. Taking a liquid crystal display panel as an example, in each pixel, a gate of the thin film transistor is connected to a gate line, a source of the thin film transistor is connected to a data line, and a drain of the thin film transistor is connected to a pixel electrode. An active layer of the thin film transistor includes a middle portion, and a source contact portion and a drain contact portion located at both sides of the middle portion, the source contact portion being connected to the source of the thin film transistor, the drain contact portion being connected to the drain of the thin film transistor, and both the source contact portion and the drain contact portion may be doped with impurities (e.g., N-type impurities or P-type impurities) with a higher impurity concentration than the middle portion. The middle portion is opposite to the gate of the thin film transistor, and in response to that a voltage signal applied to the gate reaches a predetermined value, a carrier path is formed in the middle portion, so that a current is allowed between the source and the drain of the thin film transistor.

In some display products, the active layer is made of an oxide semiconductor having a relatively high carrier mobility, such as zinc oxide (ZnO), Indium Gallium Zinc Oxide (IGZO), and Zinc Tin Oxide (ZTO). However, the oxide semiconductor may generate a photocurrent during being irradiated with light, and thus a threshold voltage, at which the thin film transistor is turned on, of the thin film transistor is shifted, which affects electrical performance and reliability of the thin film transistor. In order to prevent the oxide thin film transistor from being affected by light, a light blocking structure is usually provided in the existing thin film transistor to prevent light from being irradiated onto the active layer, for example, in a liquid crystal display panel, in order to prevent the thin film transistor from being affected by light from a backlight source, the thin film transistor of the display substrate may be designed to be a top gate type, and a light blocking layer is provided on a side of the active layer of the top gate type thin film transistor away from the gate; alternatively, the thin film transistor of the display substrate is designed to be a bottom gate type. However, in order to ensure a good light blocking effect, an area of the light blocking layer or the gate is desired to be set to be relatively large, for example, in some products, the area of the gate is about 9 times an area of a channel region (which is a portion of the middle portion opposite to the gate), which results in a low aperture ratio of the pixel region; moreover, if the area of the gate is relatively large, a relatively large parasitic capacitance may be generated between the gate and another metal (for example, the metal of a layer in which the source and the drain are located), thereby increasing a power consumption of the display product.

Figure 2A:
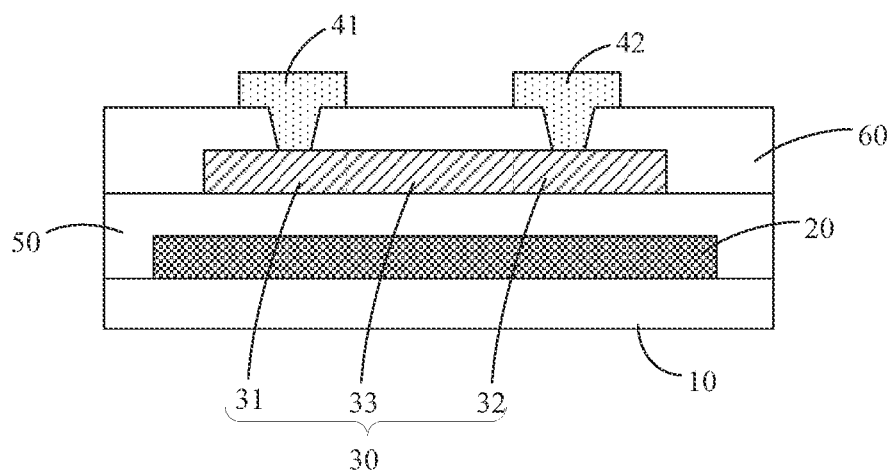
FIGS. 2A and 2B are two cross-sectional views of a structure in FIG. 1 taken along a line A-A.
Figure 2B:
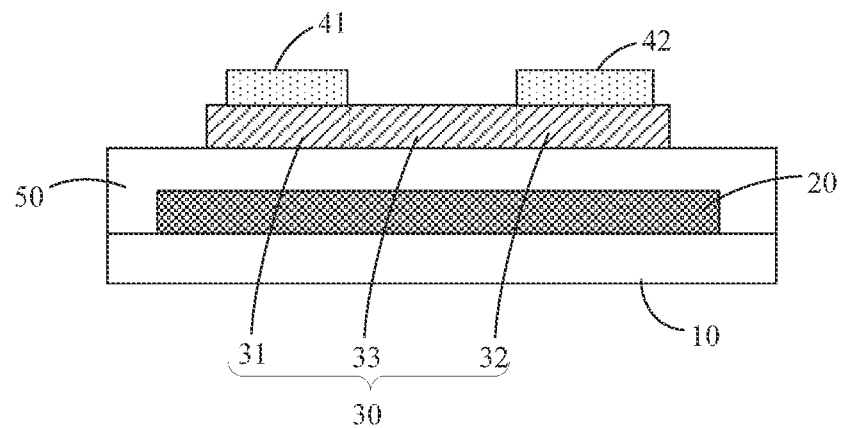

In order to solve the above technical problem, the present disclosure provides a thin film transistor, where FIG. 1 is a top view of the thin film transistor provided in the present disclosure, and FIGS. 2A and 2B are two cross-sectional views of a structure in FIG. 1 taken along a line A-A, as shown in FIGS. 1 to 2B, the thin film transistor includes a gate 20, an active layer 30, a source 41, and a drain 42 disposed on a base substrate 10.

The gate 20 is located on a side of the active layer 30 away from the base substrate 10, and a material of the gate 20 may include, for example, a metal, a metal alloy, a metal nitride, a conductive metal oxide, and the like. For example, the gate 20 may include gold, a gold alloy, silver, a silver alloy, aluminum, an aluminum alloy, aluminum nitride, tungsten, tungsten nitride, copper, a copper alloy, nickel, chromium, chromium nitride, molybdenum, a molybdenum alloy, titanium nitride, platinum, tantalum, tantalum nitride, neodymium, scandium, strontium ruthenium oxide, zinc oxide, tin oxide, or the like. The gate 20 may have a single layered structure or a multi-layered structure.

The active layer 30 is insulated and spaced apart from the gate 20, for example, a gate insulating layer 50 is disposed between the active layer 30 and the gate 20. A material of the gate insulating layer 50 may include a silicon compound, for example, silicon oxynitride, silicon oxide, silicon nitride, silicon oxycarbide, silicon carbonitride, or the like. The active layer 30 includes: a source contact portion 31, a drain contact portion 32 and an middle portion 33 between the source contact portion 31 and the drain contact portion 32, where an orthographic projection of the middle portion 33 on the base substrate 10 overlaps with an orthographic projection of the gate 20 on the base substrate 10, so that a first overlapping region is formed. A ratio of an area of the orthographic projection of the gate 20 on the base substrate 10 to an area of the first overlapping region is less than 3. A material of the middle portion 33 includes a metal oxide containing doped particles, and a dissociation energy of the doped element from an oxygen element in the middle portion 33 is greater than 500 Kj/mol. The source 41 is electrically connected to the source contact portion 31, and the drain 42 is electrically connected to the drain contact portion 32.

In some examples, as shown in FIG. 2A, a passivation layer 60 is disposed on a side of the active layer 30 away from the base substrate 10, and the source 41 and the drain 42 are located on a side of the passivation layer 60 away from the base substrate 10 and connected to the active layer 30 through via holes in the passivation layer 60. A material of the source 41 and the drain 42 may include a metal, an alloy, a metal nitride, a conductive metal oxide, and the like. For example, the source 41 and the drain 42 may have a single layered structure or a multi-layered structure made of metal, for example, Mo/Al/Mo or Ti/Al/Ti.

In other examples, as shown in FIG. 2B, no passivation layer 60 is disposed on the side of the active layer 30 away from the base substrate 10, and the source 41 and the drain 42 are located on the side of the active layer 30 away from the base substrate 10 and directly overlap the active layer 30. Compared with FIG. 2A, the arrangement in FIG. 2B can simplify the structure and the manufacturing process of the thin film transistor.

In the present disclosure, the orthographic projection of the gate 20 on the base substrate 10 is not greater than three times that of the first overlapping region on the base substrate 10, so that the area of the gate 20 can be reduced, which is beneficial to improving the aperture ratio of the pixel, and a parasitic capacitance formed between the gate 20 and another conductive structure can be reduced. In addition, since the dissociation energy of the doped element from the oxygen element in the active layer 30 is relatively high (greater than 500 Kj/mol), the stability of the thin film transistor under light can be ensured, even if the gate 20 is not enough to block light from irradiating the active layer 30.

In some implementations, the ratio of the area of the orthographic projection of the gate 20 on the base substrate 10 to the area of the first overlapping region is about 2.

In some implementations, the doped element includes at least one of a rare earth element, a tungsten (W) element, and a tantalum (Ta) element.

As shown in FIGS. 1 to 2B, in some implementations, the orthographic projection of the middle portion 33 on the base substrate 10 is a first projection, the gate 20 has a plurality of first sides connected successively, an orthographic projection of at least one of the first sides on the base substrate 10 is located outside the first projection, and a distance between the orthographic projection of the at least one of the first sides on the base substrate 10 and the first projection is less than or equal to ¼ of a distance c between the source contact portion 31 and the drain contact portion 32. For example, the gate 20 is substantially rectangular and has four first sides, and an orthographic projection of each of the first sides on the base substrate 10 is located outside the first projection, where a distance between the orthographic projection of each of two first sides extending along an X direction on the base substrate 10 and the first projection is a; a distance between the orthographic projection of each of two first sides extending along a Y direction on the base substrate 10 and the first projection is b, where at least one of a and b is less than or equal to ¼ of c; for example, a and b are both less than or equal to ¼ of c.

In an example, the distance from the at least one of the first sides, the orthographic projection of which on the base substrate 10 is located outside the first projection, to the first projection is less than or equal to 1.5 μm. For example, orthographic projections of n first sides on the base substrate 10 are all located outside the first projection, and a distance from the orthographic projection of at least one of the n first sides to the first projection is less than or equal to 1.5 μm.

For example, the source contact portion 31 and the drain contact portion 32 are arranged in the X direction, a dimension of the middle portion 33 in the X direction is c, a dimension of the middle portion 33 in the Y direction is d, c is about 6 μm, d is about 4 μm, a≤1.5 μm, and b≤1.5 μm. Alternatively, a≤1 μm and b≤1 μm.

As shown in FIG. 1, the active layer 30 has a plurality of second sides successively connected, including two second sides extending in the X direction and two second sides extending in the Y direction. In some implementations, orthographic projections of the source 41 and the drain 42 on the base substrate 10 are not in contact with orthographic projections of the two second sides extending in the Y direction on the base substrate 10.

Figure 3:
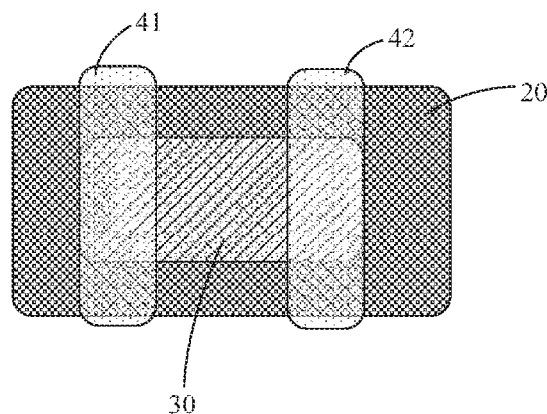
FIG. 3 is a top view of a thin film transistor provided in the present disclosure.

FIG. 3 is a top view of a thin film transistor provided in the present disclosure, and FIG. 3 shows a thin film transistor similar to the thin film transistor shown in FIG. 1, except that in FIG. 3, the orthographic projections of the source 41 and the drain 42 on the base substrate 10 are respectively in contact with orthographic projections of the two second sides, of the active layer 30, extending in the Y direction on the base substrate 10.

Figure 4A:
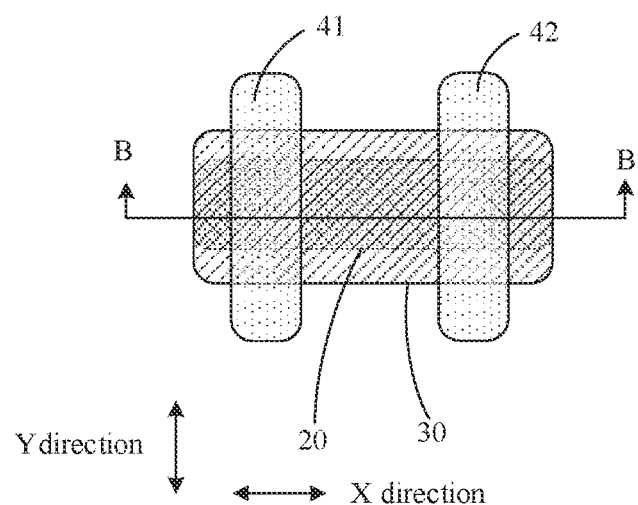
FIG. 4A is a top view of a thin film transistor provided in the present disclosure.
Figure 4B:
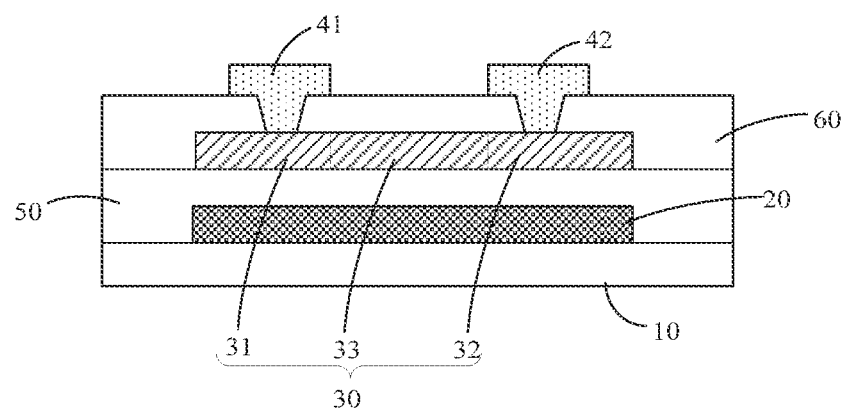
FIGS. 4B and 4C are two cross-sectional views of a structure of FIG. 4A taken along a line B-B.
Figure 4C:
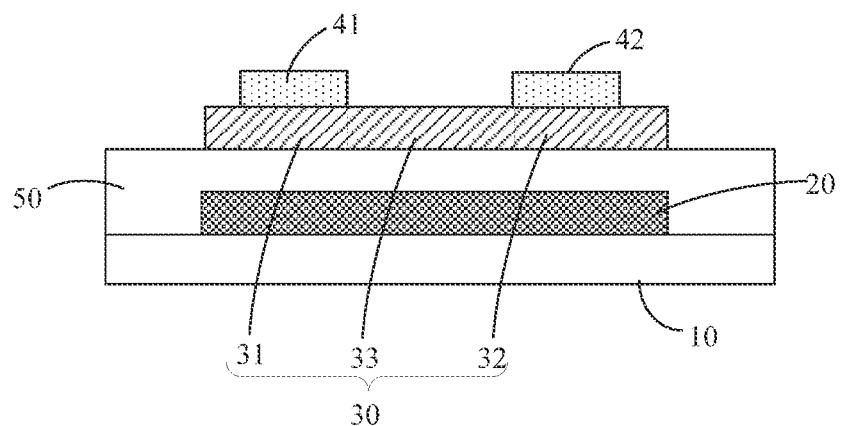

FIG. 4A is a top view of a thin film transistor provided in the present disclosure, and FIGS. 4B and 4C are two cross-sectional views of a structure in FIG. 4A taken along a line B-B, and the thin film transistor shown in FIGS. 4A and 4B is similar to the thin film transistor shown in FIGS. 1 and 2A, except that in FIGS. 4A and 4B, a portion of the orthographic projection of the middle portion 33 on the base substrate 10 exceeds the orthographic projection of the gate 20 on the base substrate 10. For example, an orthographic projection of a first portion of the middle portion 33 on the base substrate 10 is located within the orthographic projection of the gate 20 on the base substrate 10, and orthographic projections of a second portion and a third portion of the middle portion 33 on the base substrate 10 are respectively located on both sides of the orthographic projection of the gate 20 on the base substrate 10 in the Y direction. The structure shown in FIG. 4C is similar to that of FIG. 4B, except that in FIG. 4C, no passivation layer 60 is provided, and the source 41 and the drain 42 are not connected to the active layer 30 through the via holes in the passivation layer 60, but directly overlap the active layer 30.

Since the material of the active layer 30 includes the metal oxide containing the doped element, bonding energy of the doped element and the metal oxide is relatively high, which is advantageous for improving the stability of the active layer 30 under light, and thus, even if the gate 20 cannot completely block light from irradiating the middle portion 33, the stability of the thin film transistor can be ensured.

Figure 5:
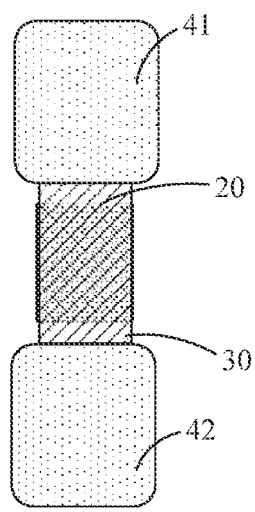
FIG. 5 is a top view of a thin film transistor provided in the present disclosure.

FIG. 5 is a top view of a thin film transistor provided in the present disclosure, and the thin film transistor shown in FIG. 5 is similar to the thin film transistor shown in FIG. 4A, except that in FIG. 5, the orthographic projections of the source 41 and the drain 42 on the base substrate 10 are not overlapped with the orthographic projection of the gate 20 on the base substrate 10, an orthographic projection of a first portion of the middle portion 33 on the base substrate 10 is located within the orthographic projection of the gate 20 on the base substrate 10, and orthographic projections of a second portion and a third portion of the middle portion 33 on the base substrate 10 are respectively located on two sides of the orthographic projection of the gate 20 on the base substrate 10 along the X direction.

The present disclosure further provides a display substrate, which includes the thin film transistor described above.

The display substrate may be adopted in a liquid crystal display panel or an organic light emitting diode (OLED) display panel. The following description will be given by taking a case where the display substrate is used in a liquid crystal display panel as an example.

Figure 6:
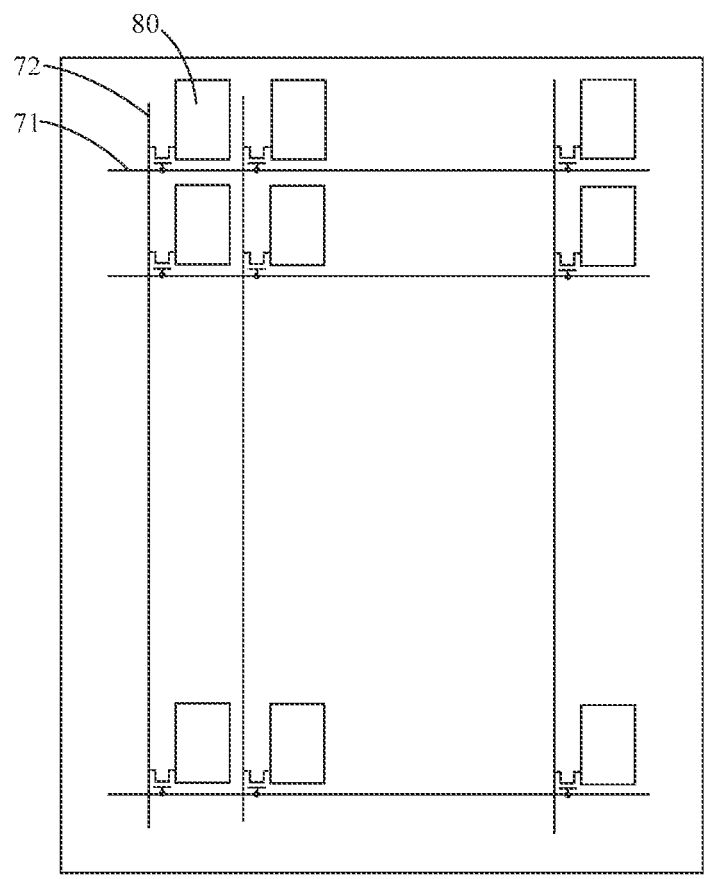
FIG. 6 is a schematic view of a display substrate provided in the present disclosure.

FIG. 6 is a schematic diagram of a display substrate provided in the present disclosure, as shown in FIG. 6, the display substrate includes a display area, the display area includes a plurality of first signal lines 71 and a plurality of second signal lines 72, the plurality of first signal lines 71 and the plurality of second signal lines 72 intersect to define a plurality of pixels, each pixel has a thin film transistor disposed therein, a gate 20 of the thin film transistor is connected to one of the first signal lines 71, a source 41 of the thin film transistor is connected to one of the second signal lines 72, and a drain 42 of the thin film transistor may be connected to a pixel electrode 80. Illustratively, the plurality of pixels are arranged in a plurality of rows and a plurality of columns, the thin film transistors of the pixels in a same row are connected to a same one of the first signal lines 71, and the thin film transistors of the pixels in a same column are connected to a same one of the second signal lines 72. The first signal lines 71 are, for example, gate lines, and the second signal lines 72 are, for example, data lines.

In some implementations, the first signal lines 71 each extend in a first direction (i.e., the X direction mentioned above), and the second signal lines 72 each extend in a second direction (i.e., the Y direction mentioned above), the first direction intersects the second direction.

Figure 7:
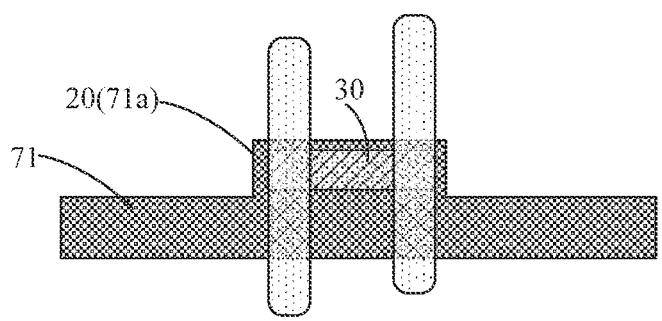
FIG. 7 is a schematic diagram illustrating a connection between a gate line and a thin film transistor provided in the present disclosure.

FIG. 7 is a schematic diagram illustrating a connection between a gate line and a thin film transistor provided in the present disclosure, a positional relationship between at least one thin film transistor and the gate 20 is shown in FIG. 7, the source contact portion 31 and the drain contact portion 32 of the active layer 30 are arranged along the first direction, a protrusion 71a is formed on a side of the first signal line 71 along the second direction, and the protrusion 71a serves as the gate 20 of the thin film transistor. That is, the gate 20 of at least one thin film transistor and the gate line are formed into a single piece.

The orthographic projection of the active layer 30 on the base substrate 10 may be located within the orthographic projection of the gate 20 on the base substrate 10, or a part of the orthographic projection of the active layer 30 on the base substrate 10 may excess the orthographic projection of the gate 20 on the base substrate 10.

Figure 8A:
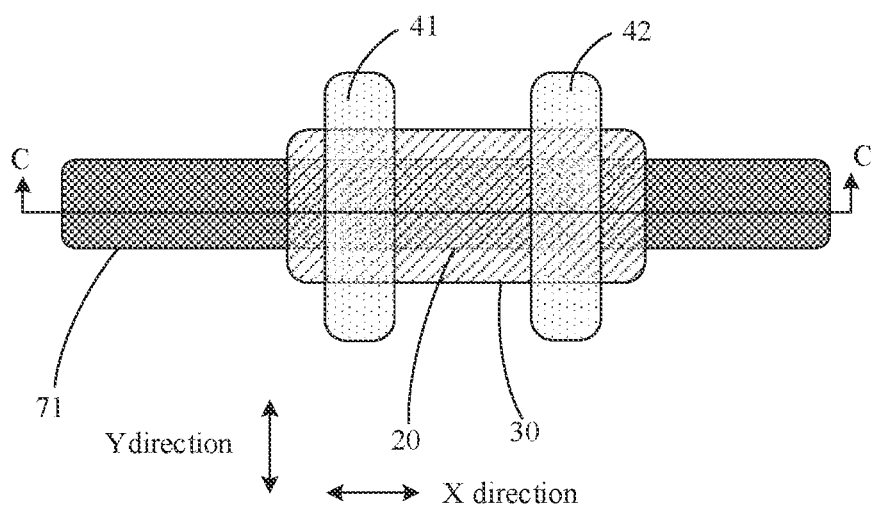
FIG. 8A is a schematic diagram illustrating a connection between a gate line and a thin film transistor provided in the present disclosure.
Figure 8B:
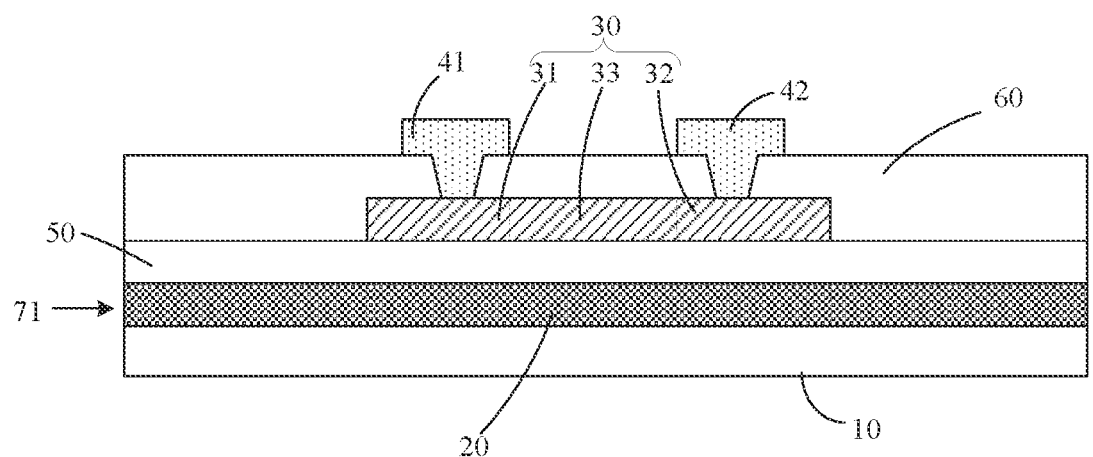
FIGS. 8B and 8C are two cross-sectional views of a structure of FIG. 8A taken along a line C-C.
Figure 8C:
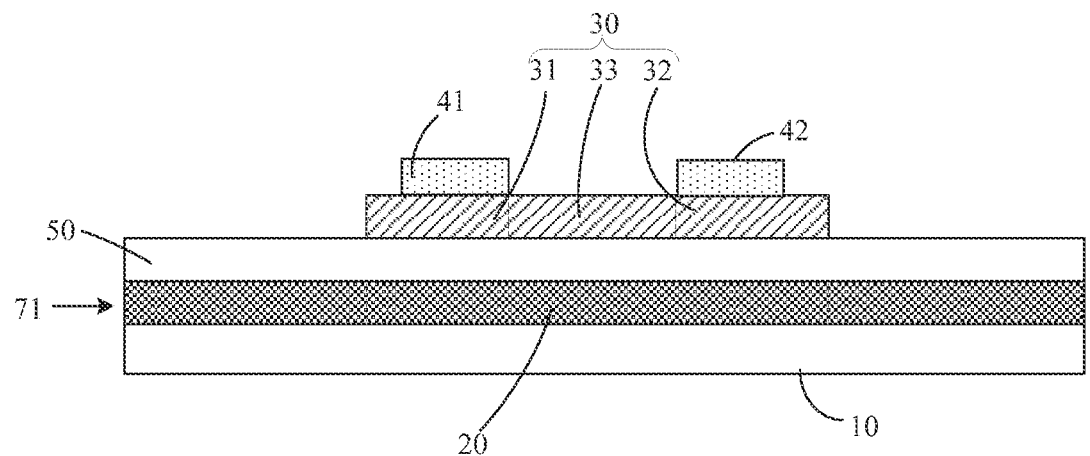

FIG. 8A is a schematic view illustrating a connection between a gate line and a thin film transistor provided in the present disclosure, and FIGS. 8B and 8C are two cross-sectional views of a structure of FIG. 8A taken along a line C-C, a positional relationship between at least one thin film transistor and the gate line is shown in FIGS. 8A and 8B, and a portion of the first signal line 71 connected to the thin film transistor is disposed opposite to the active layer 30, where the portion of the first signal line 71 opposite to the active layer 30 serves as the gate 20 of the thin film transistor. The "portion of the first signal line 71 opposite to the active layer 30" refers to a portion of the first signal line 71 whose orthographic projection on the base substrate falls within the orthographic projection of the active layer 30 on the base substrate.

In addition, for the at least one thin film transistor, as shown in FIGS. 8A and 8B, the source contact portion 31 and the drain contact portion 32 are arranged in the first direction, and an orthographic projection of the first signal line 71 connected to the thin film transistor on the base substrate 10 passes through the orthographic projection of the middle portion 33 on the base substrate 10. The structure shown in FIG. 8C is similar to that of FIG. 8B, except that in FIG. 8C, no passivation layer 60 is provided, and the source 41 and the drain 42 are not connected to the active layer 30 through the via holes in the passivation layer 60, but directly overlap the active layer 30.

Figure 9:
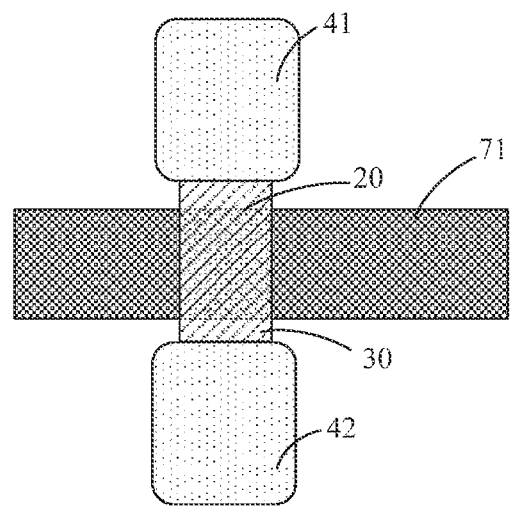
FIG. 9 is a schematic diagram illustrating a connection between a gate line and a thin film transistor provided in the present disclosure.

FIG. 9 is a schematic diagram illustrating a connection between a gate line and a thin film transistor provided in the present disclosure, a positional relationship between at least one thin film transistor and the gate line is shown in FIG. 9, similar to FIG. 8A, in FIG. 9, the first signal line 71 connected to the thin film transistor also passes through the orthographic projection of the middle portion 33 on the base substrate 10, and FIG. 9 is different from FIG. 8A only in that the source contact portion 31 and the drain contact portion 32 of the active layer 30 are arranged in the second direction, and orthographic projections of the source contact portion 31 and the drain contact portion 32 on the base substrate 10 are not overlapped with the orthographic projection of the first signal line 71 on the base substrate 10.

It should be noted that the display substrate may further include a gate driving circuit and the like located in a peripheral area, and the gate driving circuit may include the thin film transistor described above.

The present disclosure further provides a display device, which includes the display substrate described above. The display device may be any product or component with a display function, such as an OLED panel, a quantum-dot light emitting diode (QLED) display panel, a liquid crystal panel, a mobile phone, a tablet computer, a television, a display, a notebook computer, a digital photo frame, a navigator and the like.

In the present disclosure, the thin film transistor has a relatively small area, and the stability of the thin film transistor under light can be ensured, so that the display substrate and the display device adopting the thin film transistor can have an improved aperture ratio of pixel, and the display effect is ensured.

It will be understood that the above implementations are merely exemplary implementations employed to illustrate the principles of the present disclosure, and the present disclosure is not limited thereto. It will be apparent to those skilled in the art that various changes and modifications may be made without departing from the spirit and scope of the present disclosure, and these changes and modifications are to be considered within the scope of the present disclosure.

What is claimed is:

1. A thin film transistor, comprising:
   a gate disposed on a base substrate;
   an active layer located between the gate and the base substrate and insulated and spaced from the gate, where the active layer comprises a source contact portion, a drain contact portion and a middle portion located between the source contact portion and the drain contact portion, and an orthographic projection of the middle portion on the base substrate is overlapped with an orthographic projection of the gate on the base substrate to form a first overlapping region, a material of the middle portion comprises a metal oxide containing a doped element, and a dissociation energy of the doped element from an oxygen element is greater than 500 Kj/mol; and
   a source and a drain, the source being electrically connected to the source contact portion, the drain being electrically connected to the drain contact portion,
   wherein a ratio of an area of the orthographic projection of the gate on the base substrate to an area of the first overlapping region is less than or equal to 3.

2. The thin film transistor of claim 1, wherein the doped element comprises at least one of a rare earth element, a tungsten element, or a tantalum element.

3. The thin film transistor of claim 1, wherein the orthographic projection of the middle portion on the base substrate is a first projection, the gate comprises a plurality of first sides connected successively, an orthographic projection of at least one of the first sides on the base substrate is located outside the first projection, and a distance between the orthographic projection of the at least one of the first sides on the base substrate and the first projection is less than or equal to ¼ of a distance between the source contact portion and the drain contact portion.

4. The thin film transistor of claim 3, wherein a distance from the at least one of the first sides, whose orthographic projection on the base substrate is located outside the first projection, to the first projection is less than or equal to 1.5 µm.

5. The thin film transistor of claim 3, wherein an orthographic projection of each of the plurality of first sides on the base substrate is located outside the first projection.

6. The thin film transistor of claim 1, wherein a part of the orthographic projection of the middle portion on the base substrate exceeds the orthographic projection of the gate on the base substrate.

7. A display substrate, comprising the thin film transistor of claim 1.

8. The display substrate of claim 7, further comprising: a plurality of first signal lines and a plurality of second signal lines, wherein the first signal lines and the second signal lines are intersected to define a plurality of pixel regions, each pixel region is provided with a thin film transistor therein, the gate of each thin film transistor is connected with one of the first signal lines, and the source of each thin film transistor is connected with one of the second signal lines.

9. The display substrate of claim 8, wherein the first signal lines each extend in a first direction, and for at least one thin film transistor, the source contact portion and the drain contact portion are arranged along the first direction, a protrusion serving as the gate of the thin film transistor is formed on a side of the first signal line along a second direction, and the first direction intersects the second direction.

10. The display substrate of claim 8, wherein for at least one thin film transistor, a portion of the first signal line connected to the thin film transistor is provided opposite to the active layer of the thin film transistor, and the portion of the first signal line opposite to the active layer serves as the gate of the thin film transistor.

11. The display substrate of claim 10, wherein the first signal lines each extend in a first direction, and for at least one thin film transistor, the source contact portion and the drain contact portion are arranged along the first direction, and an orthographic projection of the first signal line connected to the thin film transistor on the base substrate passes through the orthographic projection of the middle portion on the base substrate.

12. The display substrate of claim 10, wherein the first signal lines each extend in a first direction, and for at least one thin film transistor, the source contact portion and the drain contact portion are arranged along a second direction, an orthographic projection of the first signal line connected to the thin film transistor on the base substrate passes through the orthographic projection of the middle portion on the base substrate, and the first direction intersects the second direction.

13. A display device, comprising the display substrate of claim 7.

14. The thin film transistor of claim 2, wherein the orthographic projection of the middle portion on the base substrate is a first projection, the gate comprises a plurality of first sides connected successively, an orthographic projection of at least one of the first sides on the base substrate is located outside the first projection, and a distance between the orthographic projection of the at least one of the first sides on the base substrate and the first projection is less than or equal to ¼ of a distance between the source contact portion and the drain contact portion.

15. The thin film transistor of claim 14, wherein a distance from the at least one of the first sides, whose orthographic projection on the base substrate is located outside the first projection, to the first projection is less than or equal to 1.5 µm.

16. The thin film transistor of claim 15, wherein an orthographic projection of each of the plurality of first sides on the base substrate is located outside the first projection.

17. The thin film transistor of claim 2, wherein a part of the orthographic projection of the middle portion on the base substrate exceeds the orthographic projection of the gate on the base substrate.

18. A display device, comprising the display substrate of claim 8.

19. A display device, comprising the display substrate of claim 9.

20. A display device, comprising the display substrate of claim 10.

* * * * *